US011353498B2

(12) United States Patent
Hsiao

(10) Patent No.: US 11,353,498 B2
(45) Date of Patent: Jun. 7, 2022

(54) FEEDBACK BURN-IN DEVICE OF BURN-IN OVEN

(71) Applicant: HONGBANG AUTOMATION CO., LTD., Taoyuan (TW)

(72) Inventor: Kuo-Ching Hsiao, Taoyuan (TW)

(73) Assignee: Hongbang Automation Co., Ltd., Taoyuan (TW)

( * ) Notice: Subject to any disclaimer, the term of this patent is extended or adjusted under 35 U.S.C. 154(b) by 207 days.

(21) Appl. No.: 16/835,885

(22) Filed: Mar. 31, 2020

(65) Prior Publication Data

US 2021/0247439 A1    Aug. 12, 2021

(30) Foreign Application Priority Data

Feb. 6, 2020 (TW) ................................. 109201343

(51) Int. Cl.
*G01R 31/28* (2006.01)
(52) U.S. Cl.
CPC ..... *G01R 31/2875* (2013.01); *G01R 31/2862* (2013.01)
(58) Field of Classification Search
None
See application file for complete search history.

(56) References Cited

U.S. PATENT DOCUMENTS 5,659,245 A * 8/1997 Ping .................... G01R 1/18
324/750.05
7,296,430 B2 * 11/2007 Hamilton ........... G01R 31/2862
62/259.2

(Continued)

FOREIGN PATENT DOCUMENTS

| CN | 211856811 U | * | 11/2020 | |
|---|---|---|---|---|
| JP | 4642437 B2 | * | 3/2011 | ......... G01R 31/2862 |
| JP | 2014105996 A | * | 6/2014 | |

(Continued)

*Primary Examiner* — Jermele M Hollington
(74) *Attorney, Agent, or Firm* — Rosenberg, Klein & Lee

(57) ABSTRACT

A feedback burn-in device of a burn-in oven includes at least one burn-in rack disposed in the burn-in oven, at least one burn-in board, and at least one feedback burn-in unit. The burn-in rack is formed, in a top thereof, with at least one horizontal ventilation passage in communication with an interior of the burn-in rack. The horizontal ventilation passage has an end connected to at least one negative pressure zone or heat dissipation blower of the burn-in oven. The burn-in board is disposed in the interior of the burn-in rack. The burn-in board is connected to a socket to which at least one tested IC is connectable. The feedback burn-in unit is connected to the socket and the burn-in board. The feedback burn-in unit provide automatic feedback control for a burn-in board environment temperature, tested IC temperature detection, and a tested IC burn-in temperature, a dissipating airflow speed, and a burn-in board environment temperature, so as to discharge heat-dissipation hot air from the burn-in board and the tested IC of each feedback burn-in unit to the horizontal ventilation passage of the burn-in rack to be further discharge through one end of the horizontal ventilation passage to a negative pressure zone or a discharge blower of the burn-in oven, thereby forming a feedback burn-in device featuring automatic feedback burn-in and heat dissipative airflow discharged to the burn-in oven.

10 Claims, 11 Drawing Sheets

(56) References Cited

U.S. PATENT DOCUMENTS

| | | | | |
|---|---|---|---|---|
| 11,175,336 B2* | 11/2021 | Chang | ................ | G01R 31/2875 |
| 2003/0112025 A1* | 6/2003 | Hamilton | ........... | G01R 31/2862 |
| | | | | 324/750.14 |
| 2005/0103034 A1* | 5/2005 | Hamilton | ........... | G01R 31/2862 |
| | | | | 62/186 |
| 2005/0179457 A1* | 8/2005 | Min | ................... | G01R 31/2877 |
| | | | | 324/750.05 |
| 2012/0206157 A1* | 8/2012 | Liu | ................... | G01R 31/2875 |
| | | | | 324/750.05 |

FOREIGN PATENT DOCUMENTS

| | | | | | |
|---|---|---|---|---|---|
| KR | 20050046613 A | * | 5/2005 | ......... | G01R 31/2862 |
| TW | I456219 B | | 10/2014 | | |
| TW | I639844 B | | 11/2018 | | |
| TW | I659484 B | | 5/2019 | | |
| TW | I664431 B | | 7/2019 | | |

* cited by examiner

FEEDBACK BURN-IN DEVICE OF BURN-IN OVEN

BACKGROUND OF THE INVENTION

1. Field of the Invention

The present invention relates to a feedback burn-in device of a burn-in oven, and more particularly to a feedback burn-in device applicable to integrated circuit (IC) burn-in tests in a burn-in oven and featuring automatic feedback control and controlled discharge of heat-dissipative airflows for individual IC tests carried out with various temperature conditions.

2. The Related Arts

It is common that integrated circuits (ICs) of central processor units (CPUs), graphic processor units (GPUs), chipsets, and network communication applications and the likes must be subjected to burn-in tests carried out with a burn-in oven in order to inspect the properties of the ICs and also characteristics of working environments at elevated temperatures. Manufacture and design of IC are increasingly complicated, and ICs, such as CPUs, GPUs, and network communication application ICs, suffer increasingly issues of high energy consumption in the burn-in operations, and this significantly affect accuracy of temperature control in the burn-in tests and consequently, events of overloading, such as overvoltage and overcurrent, may occur in the burn-in test system, leading to initiation of protection procedure or even causing shut-down of the burn-in test system, which would severely affect performance of IC test and yield. It is even worse that rising of the test temperature applied to test ICs may happen instantaneously so that the protection system may not timely respond and start and the tested ICs get burnt out.

In the existing burn-in oven, a temperature homogenization solution relies generally on blow of heat-dissipative airflow directly applied toward ICs under test or applied toward the IC from either the left side or the right side. However, direct blow of airflow in either a downward direction or a leftward or rightward direction often cause a situation of being hard to control the temperatures of individual ones of the ICs under test as circulation has to take place in a large-sized enclosed chamber, and as such, it takes a long time for the temperature to become steady. Further, to ensure control of temperature homogenization for testing of ICs on each individual layer of the existing burn-in oven, the type and test condition of all the ICs under test in the same layer must be identical for unified control of the test temperature. This imposes severe constraint to the test range and application for IC testing and in addition, since each IC under test is set in a heat-dissipative airflow that is not uniform in temperature, it is hard to ensure proper control and accuracy of the test temperature. This leads to lowering of the performance and accuracy of the IC burn-in operations and is apparently an issue to be overcome in the art of IC burn-in.

Further, prior art patent documents are known, such as Taiwan Patent Nos. 1659484, 1639844, and 1456219, provide known structures and techniques of burn-in ovens as discussed above. In other words, such prior art patent documents all teach a structure of a burn-in oven in which a heat-dissipative airflow is blown from one lateral side or the topside to cause circulation. In addition to the problems of severe energy consumption required for IC burn-in operations, which leads to severe influence on temperature control of the burn-in operations that further results in overloading of overvoltage and overcurrent occurring in the a burn-in test system that might undesirably initiate a protection mechanism to shut down the system so as to affect performance of IC test and yield or might cause instantaneous increase of an IC test temperature to which the protection mechanism may not timely respond to thereby cause ICs under test to be burnt out, techniques of such prior art documents also suffer the problem that homogenization of temperature is realized through circulation inside a large-sized enclosed chamber, making temperature control of the temperature individual ICs hard and requiring an extended period of time for the temperature to reach a steady condition, and ICs placed on the same layer in the burn-in oven being required to be of the same type and placed in the same test temperature condition, leading to significant constraint to the test and application of IC burn-in, and each IC under test being set in a heat-dissipative airflow of non-uniform temperature, making it hard to realize good and accurate control of the test temperature and further lowering performance and accuracy of IC burn-in.

Further, Taiwan Patent No. 1664431 discloses a remote network-online control IC burn-in test system, which allows a burn-in operation of each IC under test in a burn-in oven to be control in a remote manner through network connection. However, such a test system does not include a feedback mechanism to feed back a test temperature of each IC under test of burn-in in a real time manner, so that a remote operator is not allowed to accurately control a simulated burn-in temperature for each IC under test in each layer, and thus such a test system still suffers the same problem that all the ICs under test on the same layer must be of the same type and the same test temperature, leading to significant constraint to the test and application of IC burn-in, and each IC under test being set in a heat-dissipative airflow of non-uniform temperature, making it hard to realize good and accurate control of the test temperature and further lowering performance and accuracy of IC burn-in.

SUMMARY OF THE INVENTION

The primary objective of the present invention is to provide a feedback burn-in device of a burn-in oven that overcomes the problems of IC burn-in systems of the prior art burn-in ovens that energy consumption required for an IC burn-in operation is severe and severely affects temperature control of the burn-in operation, resulting in overloading of overvoltage and overcurrent occurring in the a burn-in test system that might undesirably initiate a protection mechanism to shut down the system so as to affect performance of IC test and yield or might cause an instantaneous increase of an IC test temperature to which the protection mechanism may not timely respond to thereby cause ICs under test to be burnt out, and homogenization of temperature is realized through circulation inside a large-sized enclosed chamber, making temperature control of the temperature individual ICs hard and requiring an extended period of time for the temperature to reach a steady condition, and ICs placed on the same layer in the burn-in oven are required to be of the same type and placed in the same test temperature condition, leading to significant constraint to the test and application of IC burn-in, and each IC under test being set in a heat-dissipative airflow of non-uniform temperature, making it hard to realize good and accurate control of the test temperature and further lowering performance and accuracy of IC burn-in.

Thus, the present invention provides a feedback burn-in device of a burn-in oven, which comprises:

at least one burn-in rack, the burn-in rack being disposed in an interior of a burn-in oven, the burn-in rack being formed in a top thereof with at least one horizontal ventilation passage in communication with an interior of the burn-in rack, the horizontal ventilation passage having an end connected to at least one negative pressure zone or heat dissipation blower of the burn-in oven;

at least one burn-in board, the burn-in board being disposed in the interior of the burn-in rack, the burn-inboard being connected to a socket to which at least one tested IC is connectable, and at least one feedback burn-in unit, which is connected to the socket to which the tested IC is connected and the burn-in board, the feedback burn-in unit having a function of automatic feedback control of a burn-in board environment temperature, tested IC temperature detection and tested IC burn-in temperature, a dissipating airflow speed, and an environmental temperature, wherein a heat-dissipation hot air is discharged from the burn-in board and a tested IC on each feedback burn-in unit into the horizontal ventilation passage and is further discharged from one end of the horizontal ventilation passage to a negative pressure zone or a discharge blower of the burn-in oven.

Further, the feedback burn-in device of the burn-in oven according to the present invention is such that the burn-in rack is formed, in the interior thereof, with a receiving space to receive the burn-in board to dispose therein.

In the feedback burn-in device of the burn-in oven according to the present invention, at least one holed airflow guide plate is provided below the horizontal ventilation passage of the burn-in rack and is in communication with the horizontal ventilation passage of the burn-in rack to allow the heat-dissipation hot air to discharge from the burn-in board and the tested IC on each feedback burn-in unit through the holed airflow guide plate into the horizontal ventilation passage.

In the feedback burn-in device of the burn-in oven according to the present invention, the holed airflow guide plate of the burn-in rack is formed with a plurality of airflow guide hole in communication with the horizontal ventilation passage.

In the feedback burn-in device of the burn-in oven according to the present invention, the horizontal ventilation passage of the burn-in rack has an end that is formed with at least one hot airflow outlet opening in communication with the negative pressure zone and the discharge blower of the burn-in oven.

In the feedback burn-in device of the burn-in oven according to the present invention, the feedback burn-in unit comprises:

at least one bottom base, which is coupled to and carries a socket of the tested IC on the burn-in board, the bottom base having an undersurface connected to the burn-in board, the bottom base having a circumferential portion that is formed with at least one air inlet channel to draw in air from a surface of the burn-in board;

at least one top cover, which is mounted on the bottom base, the top cover being formed with a framed opening, the framed opening corresponding to a top of the tested IC on the tested IC socket, the framed opening of the top cover having a circumferential portion that is formed with at least one air flow channel, the air flow channel being in communication with the air inlet channel of the bottom base to draw in air from the surface of the burn-in board;

at least one heat dissipation fin assembly, which is mounted on the top cover, the heat dissipation fin assembly having a undersurface that is provided with a connection portion, the connection portion being connected, by way of the framed opening of the top cover, to a top of the tested IC;

at least one heater, which is mounted in an interior of the heat dissipation fin assembly to provide a function of simulation of an elevated test temperature for the heat dissipation fin assembly;

at least one fan, which is mounted on the heat dissipation fin assembly to provide the heat dissipation fin assembly with a function as a heat dissipation system to discharge the heat-dissipation hot air and to also discharge the air from the surface of the burn-in board that is drawn in through the air inlet channel of the bottom base and the air flow channel of the top cover;

at least one sensor, the sensor being arranged between the top of the tested IC and the heat dissipation fin assembly, so that the sensor detects the elevated test temperature of the tested IC; and at least one external controller, which is connected to the sensor, the heater, and the fan to respond to the elevated test temperature of the tested IC detected by the sensor to control a heating temperature of the heater and a dissipating airflow speed of the fan.

In the feedback burn-in device of the burn-in oven according to the present invention, the heat dissipation fin assembly of the feedback burn-in unit is formed with at least one receiving hole to receive the heater to dispose therein.

In the feedback burn-in device of the burn-in oven according to the present invention, the fan of the feedback burn-in unit has a bottom mounted to at least one fan mount, the fan mount being formed with at least one opening, the opening allowing the bottom of the fan and a top of the heat dissipation fin assembly to be in communication with each other, the fan mount having a circumferential portion that is formed with a plurality of coupling tabs, the coupling tabs being fit downward to outside of the top cover.

In the feedback burn-in device of the burn-in oven according to the present invention, four circumferential edges of a fan mount of the feedback burn-in unit are each formed with at least one opening to allow external cold air to be drawn in, through an air drawing operation of the fan, to cool the heat dissipation fin.

In the feedback burn-in device of the burn-in oven according to the present invention, the sensor of the feedback burn-in unit comprises a temperature sensor.

In the feedback burn-in device of the burn-in oven according to the present invention, the external controller of the feedback burn-in unit is mounted on the burn-in board.

In the feedback burn-in device of the burn-in oven according to the present invention, the external controller of the feedback burn-in unit is connected to at least one external sensor to detect an external environmental temperature, a feedback airflow temperature, and airflow speed and airflow status flowing over a top of the tested IC to be fed back to the external controller.

The efficacy of the feedback burn-in device of the burn-in oven according to the present invention is that the feedback burn-in unit is provided therein with the heater of the heat dissipation fin assembly to directly perform simulated burn-in temperature heating on the heat dissipation fin assembly to have the tested IC fast reach a burn-in test temperature, the sensor detecting an IC top surface temperature to feedback to the external controller to control increase and decrease of temperature and heating time of the heater and an airflow speed and an operation time of the fan, the external sensor connected to the external controller being operable to detect an environmental temperature, a feedback airflow temperature, and an airflow speed and airflow condition passing over the top of the tested IC to be fed back to the external controller for more accurately controlling increase and decrease of temperature and heating time of the heater and an airflow speed and an operation time of the fan, and also, each of the airflow guide holes of the holed airflow guide plate provided on a bottom of the horizontal ventilation passage of the burn-in rack to which the burn-in board corresponds draws and discharges heat-dissipation hot air from the fan on each tested IC, so as to reduce mutual interference among heat sources of the tested ICs to thereby provide a feedback burn-in device for independent and individual automatic feedback control of temperature homogenization of burn-in temperature of the tested ICs and reducing energy consumption for burn-in to quickly and steadily reach uniform temperature for each of the tested ICs, and also, the burn-in rack disposed in the burn-in board is mounted and disposed in the burn-in oven in a modularized manner, the hot airflow outlet opening at an end of the horizontal ventilation passage of the burn-in rack providing a systemic way of fluid communication with the negative pressure zone and the discharge blower of the burn-in oven to allow the heat-dissipation hot air to discharge, in a systematic way, into the burn-in oven to be collectively discharged out of the burn-in oven, and additionally, it is noted that the bottom base, the top cover, the heat dissipation fin assembly, the heater, the fan, and the sensor of each feedback burn-in unit of the feedback burn-in device of the present invention can be independently integrated with and mounted to each tested IC to carry out efficient energy distribution and individual burn-in temperature control required for the energy consumption and temperature control of each of the tested ICs, the structure being simple and fabrication and maintenance being easy, so that compared to the known IC burn-in devices discussed above or those disclosed in known patent documents, the burn-in test cost of the present invention can be greatly reduced to thereby further improve industrial utilization and economic value of the present invention.

DETAILED DESCRIPTION OF THE PREFERRED EMBODIMENTS

Figure 1:
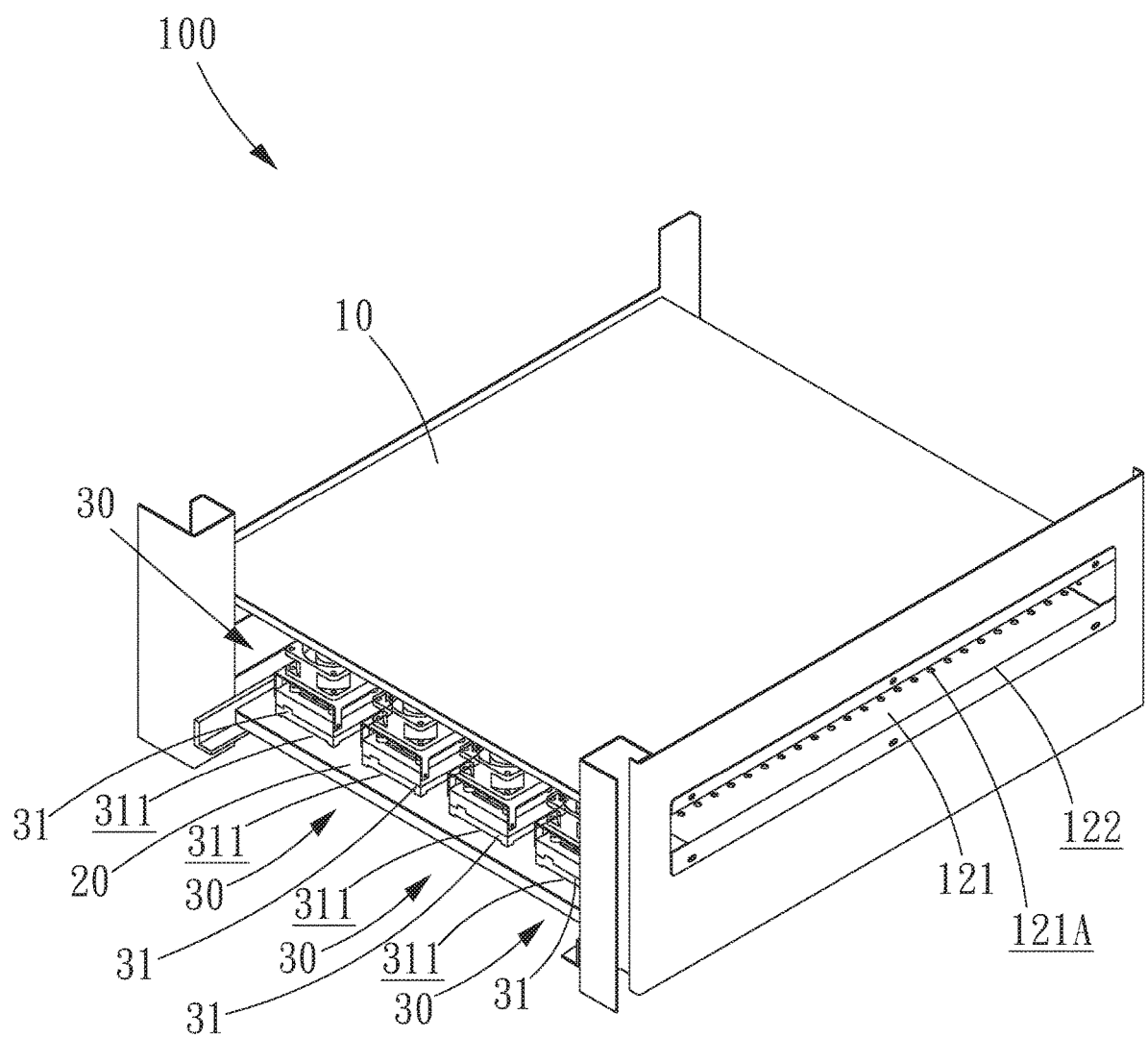
FIG. 1 is a perspective view showing a structure of a feedback burn-in device of a burn-in oven according to a first embodiment of the present invention.
Figure 2:
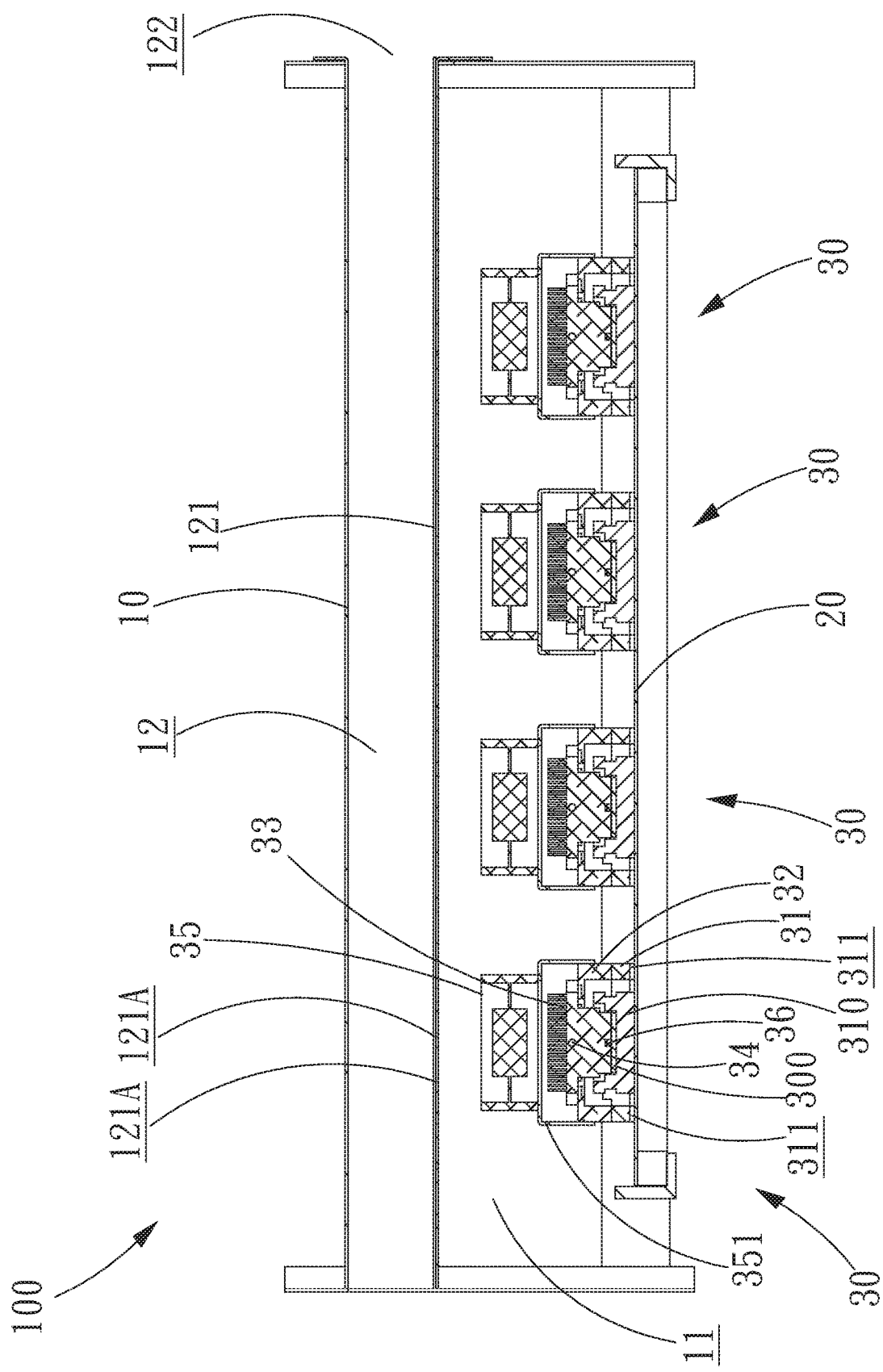
FIG. 2 is a cross-sectional view showing the feedback burn-in device of the burn-in oven according to the first embodiment of the present invention.
Figure 3:
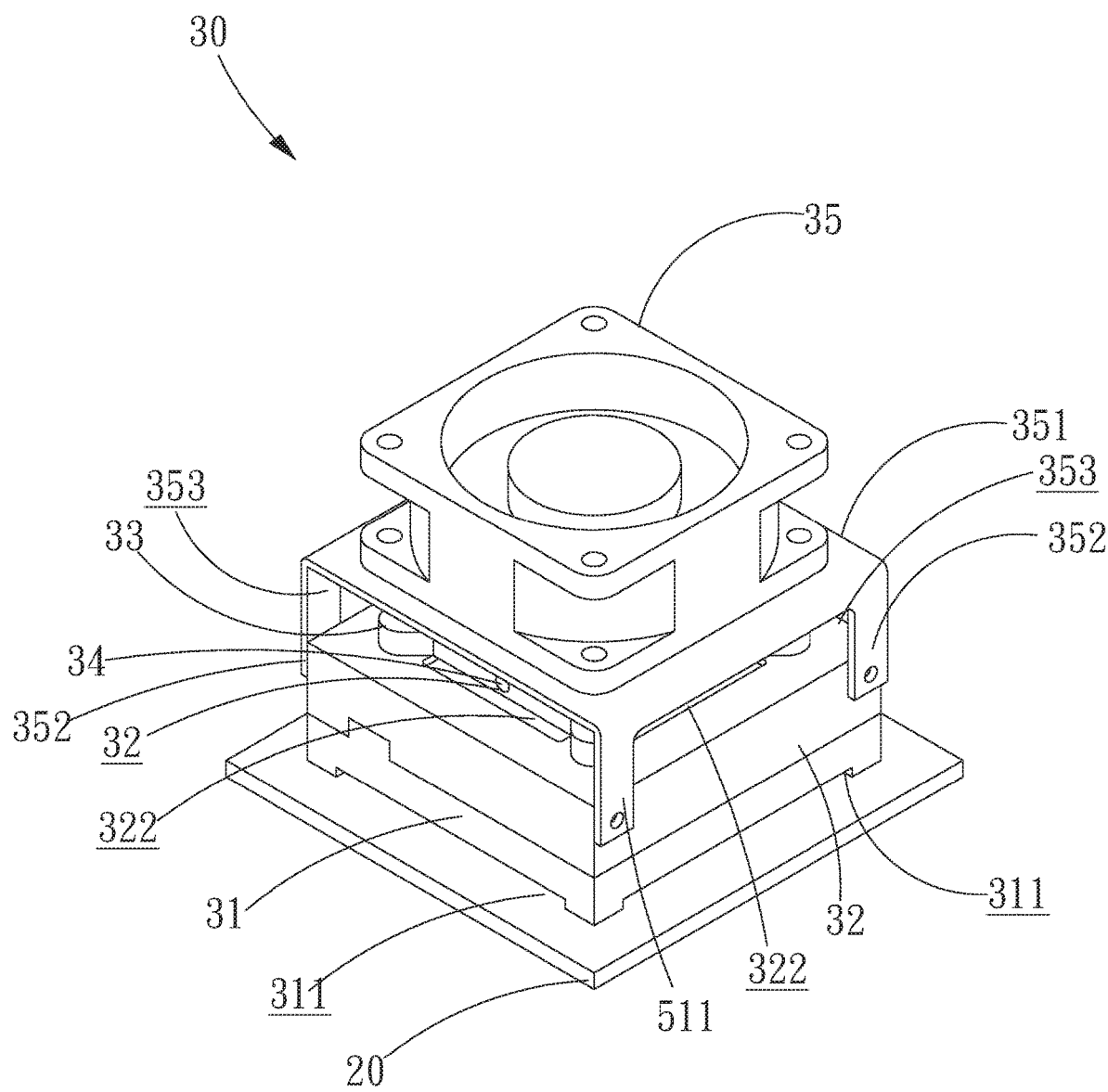
FIG. 3 is a perspective view showing a feedback burn-in unit of the feedback burn-in device of the burn-in oven according to the first embodiment of the present invention.
Figure 4:
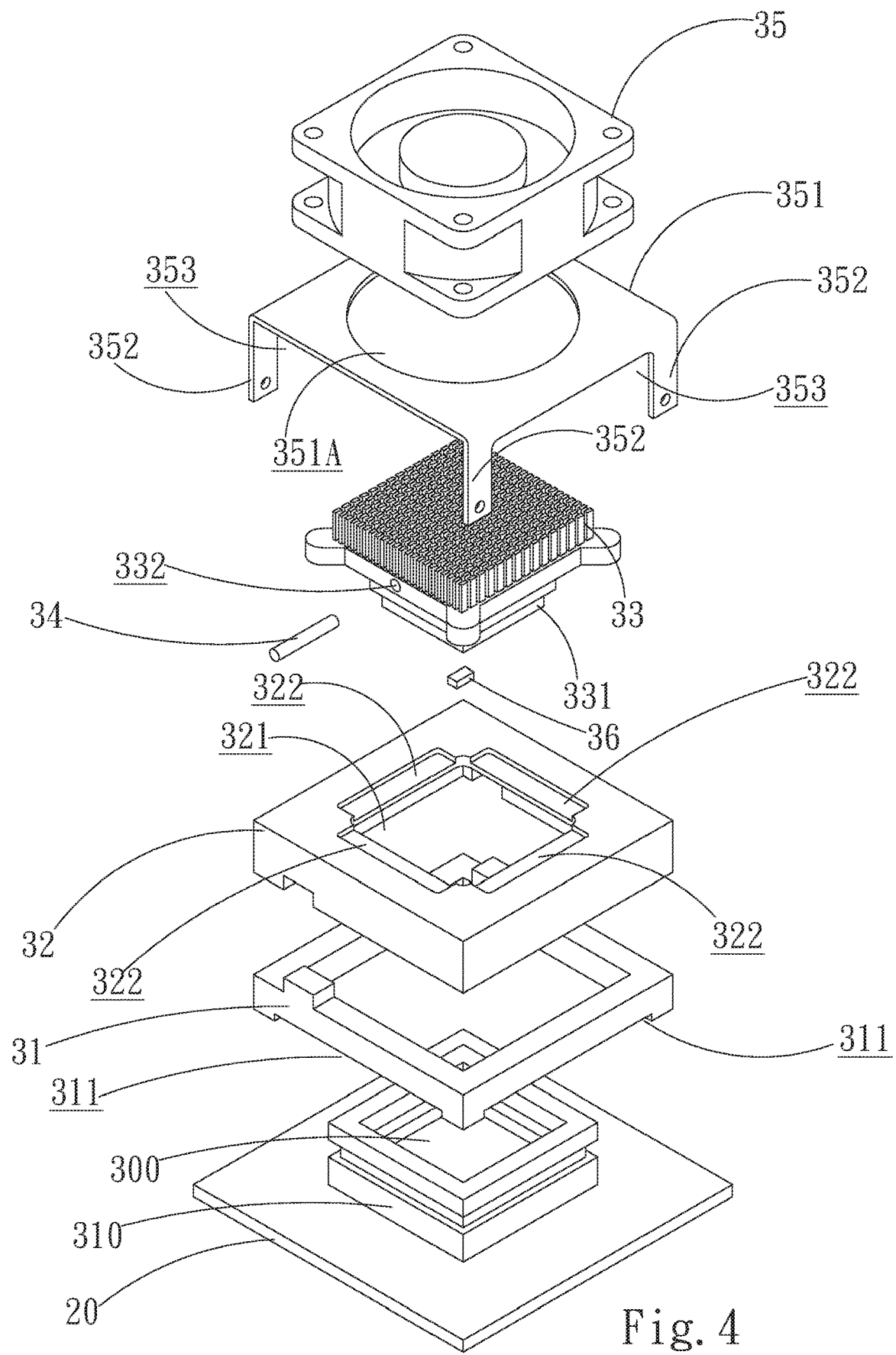
FIG. 4 is an exploded view showing the feedback burn-in unit of the feedback burn-in device of the burn-in oven according to the first embodiment of the present invention.

Referring to FIGS. 1, 2, 3, 4, 5, 6, 7, and 8, a feedback burn-in device of a burn-in oven according to a first embodiment of the present invention, generally designated at 100, is shown. The feedback burn-in device 100 comprises at least one burn-in rack 10. The burn-in rack 10 is disposed in an interior of a burn-in oven 200 (shown in phantom lines in FIG. 11). The burn-in rack 10 is formed, in an interior thereof, with a receiving space 11, and a top of the burn-in rack 10 is formed, in an interior thereof, with at least one horizontal ventilation passage 12 in communication with the receiving space 11, and at least one holed airflow guide plate 121 is provided under the horizontal ventilation passage 12. The holed airflow guide plate 121 is formed with a plurality of airflow guide holes 121A, which are in communication with the horizontal ventilation passage 12. The horizontal ventilation passage 12 is provided, at an end thereof, with a hot airflow outlet opening 122.

At least one burn-in board 20 is disposed in the receiving space 11 that is in the interior of the burn-in rack 10. The burn-in board 20 is connected to a socket 310 to which at least one tested IC 300 is connectable. The burn-in board 20 has a function of carrying out a burn-in operation on the tested IC 300. The tested IC 300 is not limited to any specific type and can be for example a microprocessor unit, a graphic processing unit, a chipset, and a network communication application IC.

Figure 8:
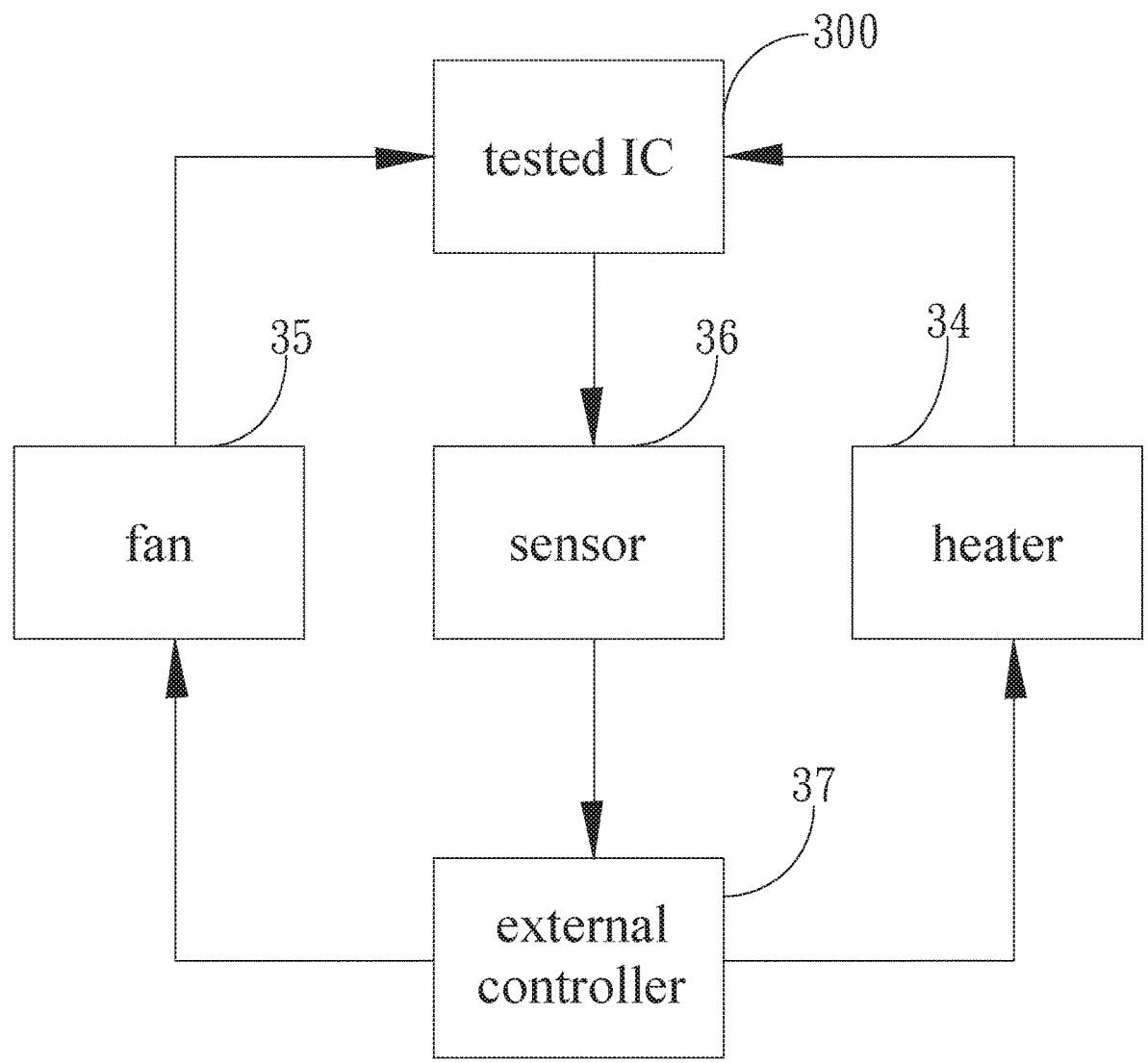
FIG. 8 is a circuit block diagram among a burn-in board of the feedback burn-in device of the burn-in oven and a sensor, a heater, a fan, and an external controller of the feedback burn-in unit according to the first embodiment of the present invention.

At least one feedback burn-in unit 30, which is not limited to any specific type, is constructed, as an illustrative example of the present invention, to include at least one bottom base 31, a top cover 32, a heat dissipation fin assembly 33, a heater 34, a fan 35, a sensor 36, and an external controller 37 (as shown in FIG. 8), wherein the bottom base 31 has an undersurface mounted to the burn-in board 20 and the socket 310. The undersurface of the bottom base 31 is provided, in each of four sides, with at least one air inlet channel 311 to draw air from a surface of the burn-in board 20.

Figure 5:
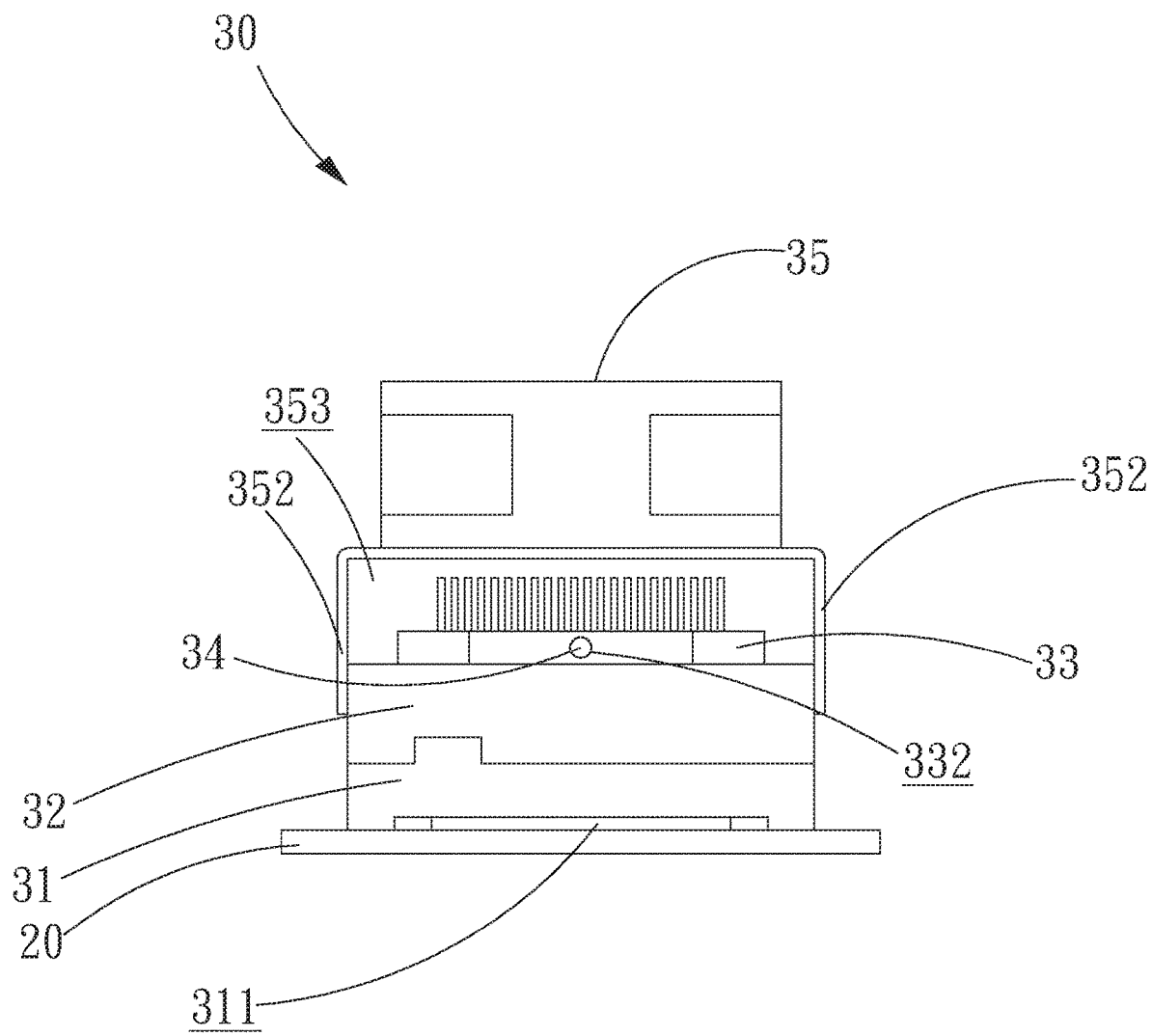
FIG. 5 is a front view showing the feedback burn-in unit of the feedback burn-in device of the burn-in oven according to the first embodiment of the present invention.
Figure 6:
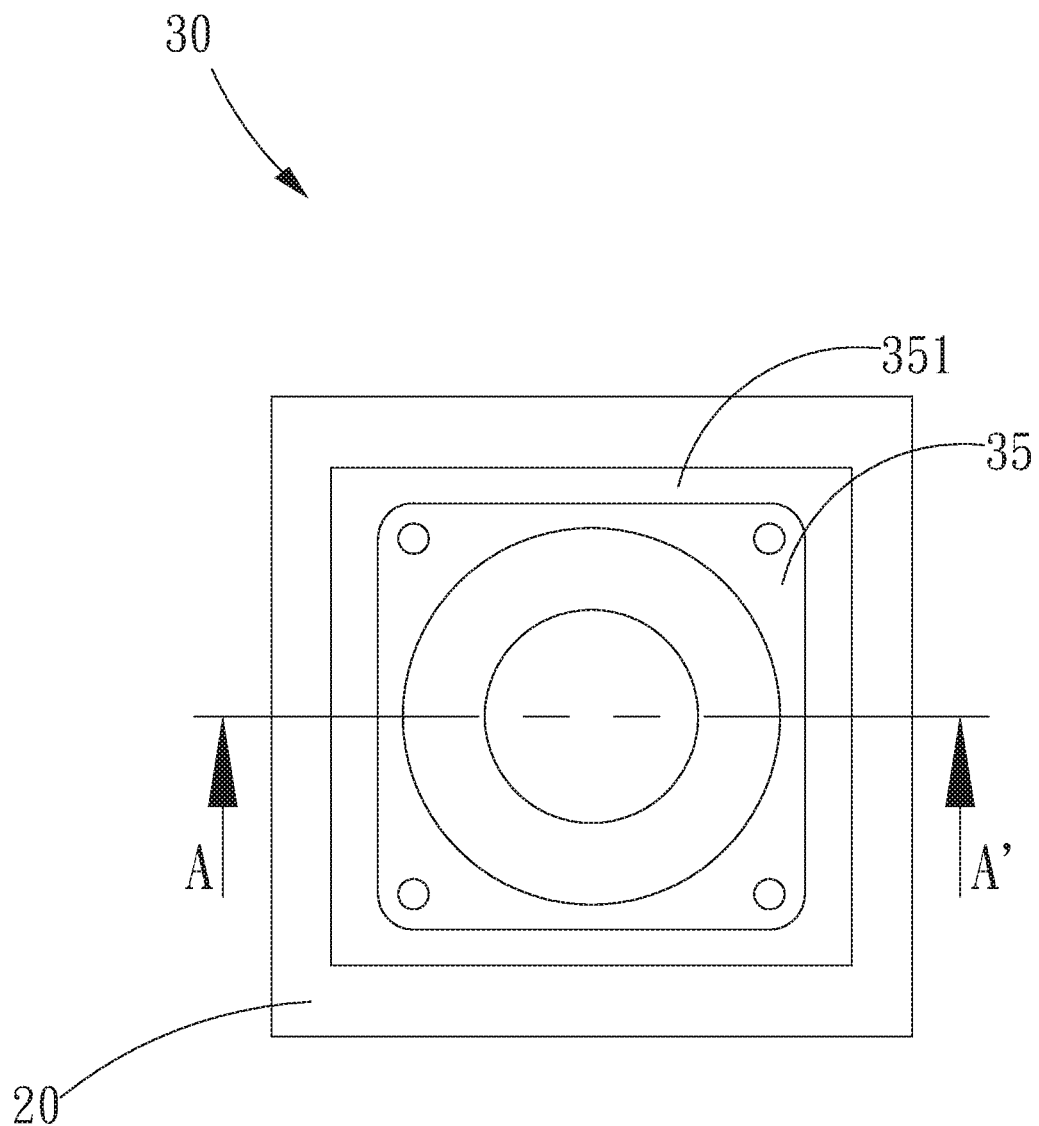
FIG. 6 is a top plan view showing the feedback burn-in unit of the feedback burn-in device of the burn-in oven according to the first embodiment of the present invention.
Figure 7:
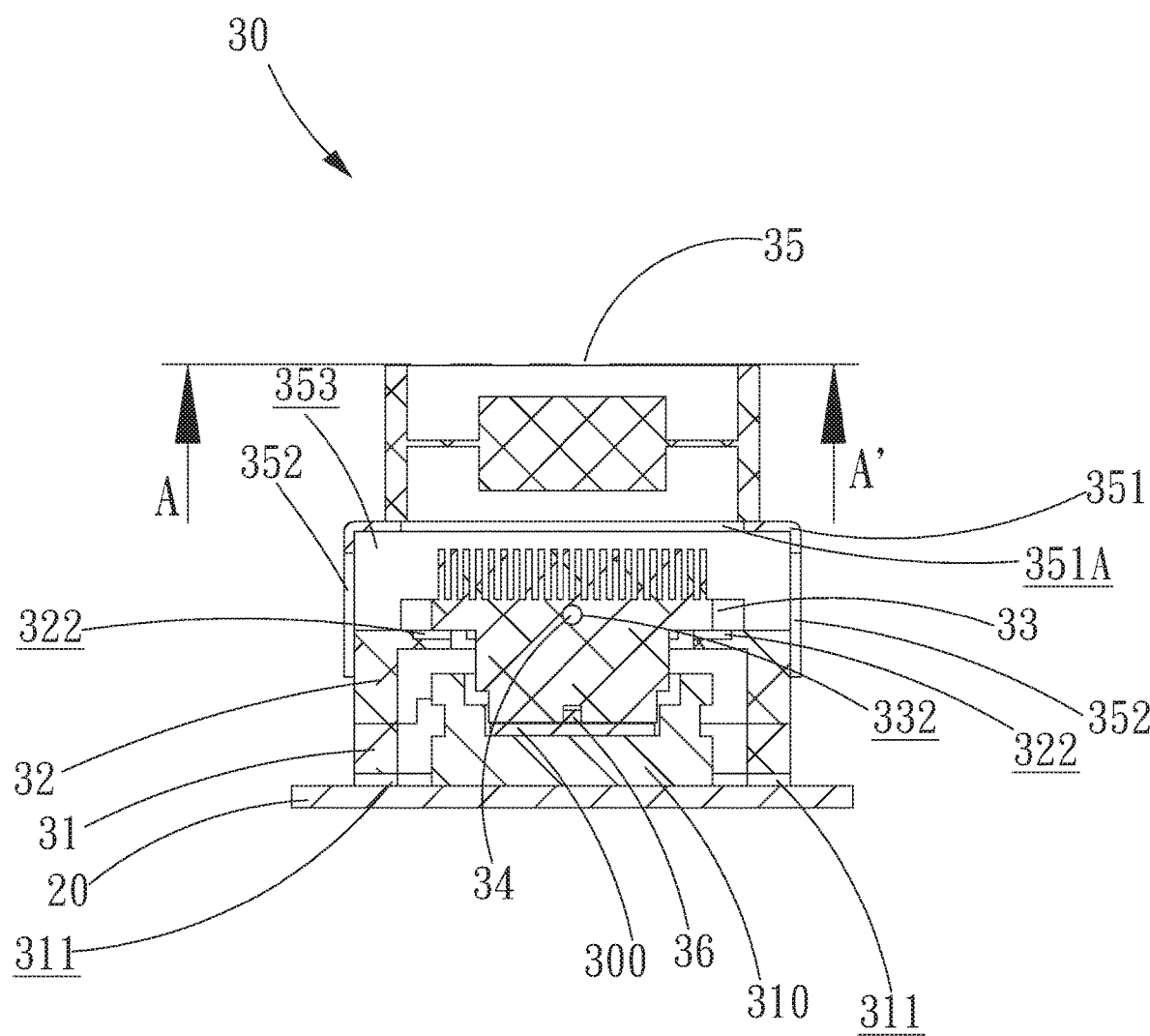
FIG. 7 is a cross-sectional view taken along line A-A' of FIG. 6.

The top cover 32 is formed with a framed opening 321, which is an opening surrounded by a frame. The framed opening 321 corresponds to a top surface of the tested IC 300 on the tested IC socket 310 of the bottom base 31. The framed opening 321 of the top cover 32 has four circumferential edges each formed with at least one air flow channel 322. The air flow channel 322 is in communication with the air inlet channel 311 of the bottom base 31 (as shown in FIG. 5) to draw in air from the surface of the burn-in board 20.

The heat dissipation fin assembly 33 is mounted on a top of the top cover 32. The heat dissipation fin assembly 33 has an undersurface that is provided with a connection portion 331. The connection portion 331 is connected, byway of the framed opening 321 of the top cover 32, to the top of the tested IC 300. The heat dissipation fin assembly 33 is formed in an interior thereof with at least one receiving hole 332.

The heater 34 is disposed in and coupled to the receiving hole 332 formed in the interior of the heat dissipation fin assembly 33 to provide a function simulation of elevation of test temperature for the heat dissipation fin assembly 33.

The fan 35 has a bottom coupled to at least one fan mount 351. The fan mount 351 is formed, in an interior thereof, with at least one opening 351A. The opening 351A allows the bottom of the fan 35 and a top of the heat dissipation fin assembly 33 to be in communication with each other. The fan mount 351 has a circumferential portion that is formed with a plurality of coupling tabs 352. The coupling tabs 352 are downward fit to outside of the top cover 32, so as to couple the fan 35 to a top side of the heat dissipation fin assembly 33. The coupling tabs 352 allow the bottom of the fan 35 and the top of the heat dissipation fin assembly 33 to be in communication with each other to provide a function as a heat dissipation system that causes heat-dissipation hot air from the heat dissipation fin assembly 30 to dissipate to the outside. The fan mount 351 has four circumferential edges each formed with at least one opening 353 to allow external cold air from outside the four circumferential edges to be drawn in through an air-drawing operation of the fan 35 to cool the heat dissipation fin 30.

The sensor 36 is mounted between the top surface of the tested IC 300 and the heat dissipation fin assembly 33, so that the sensor 36 is operable to detect an elevated test temperature of the tested IC 300.

The external controller 37, of which the location of installation is not limited, is arranged as an example in the first embodiment of the present invention, such that the external controller 37 is disposed outside the burn-in board 20. The external controller 37 is connected, separately, to the sensor 36, the heater 34, and the fan 35, so as to respond to the elevated test temperature of the tested IC 300 detected and fed back by the sensor 36 to separately control a heating temperature of the heater 34 and a dissipating airflow speed of the fan 35.

Figure 9:
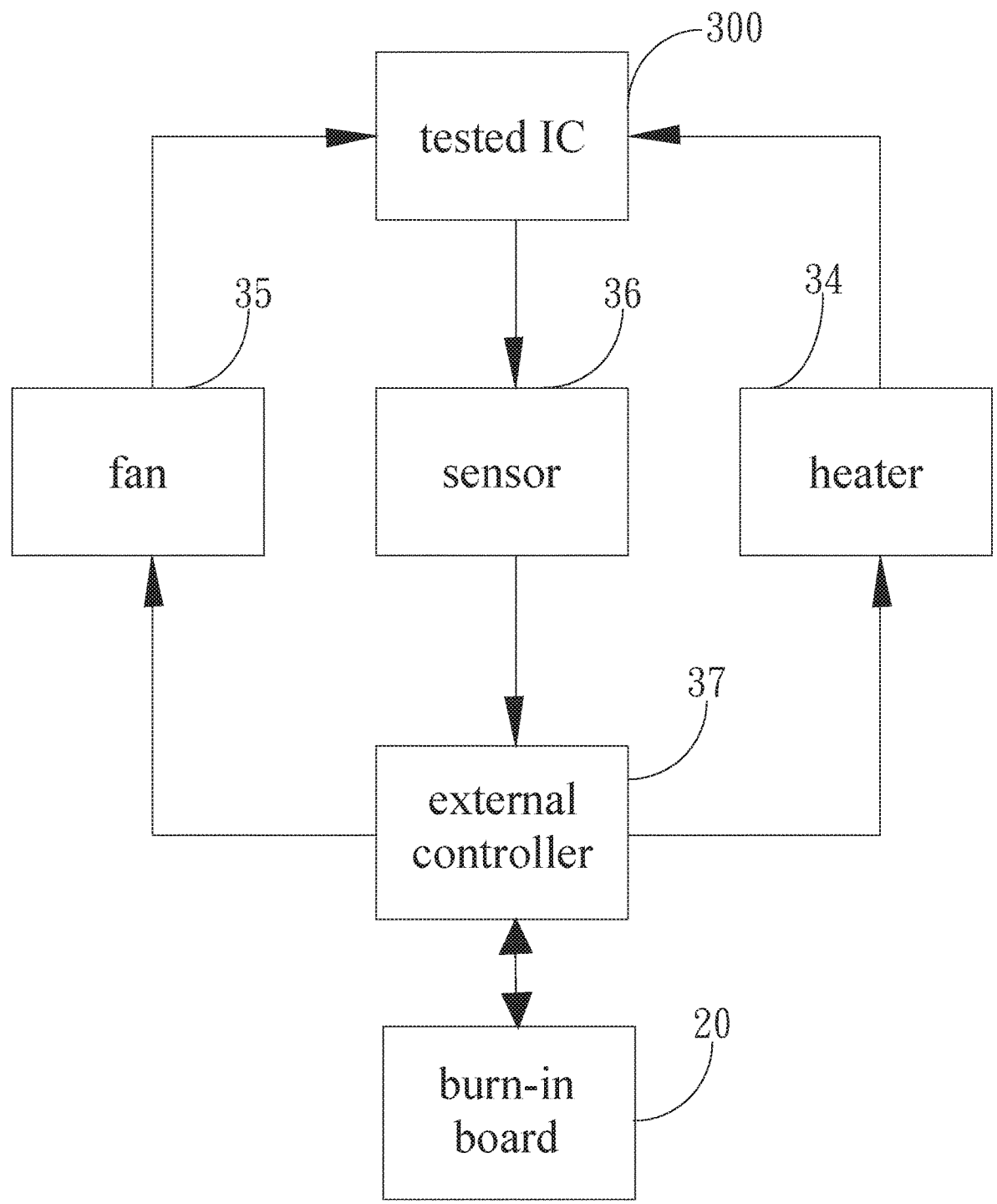
FIG. 9 illustrates a second embodiment of the present invention.

Referring further to FIG. 9, a feedback burn-in device of a burn-in oven according to a second embodiment of the present invention, also designated at 100, is shown, wherein the external controller 37 of the feedback burn-in unit 30 is disposed on the burn-in board 20, and the external controller 37 is connected, separately, to the sensor 36, the heater 34, and the fan 35, so as to respond to the elevated test temperature of the tested IC detected and fed back by the sensor 36 to separately control a heating temperature of the heater 34 and a dissipating airflow speed of the fan 35.

Figure 10:
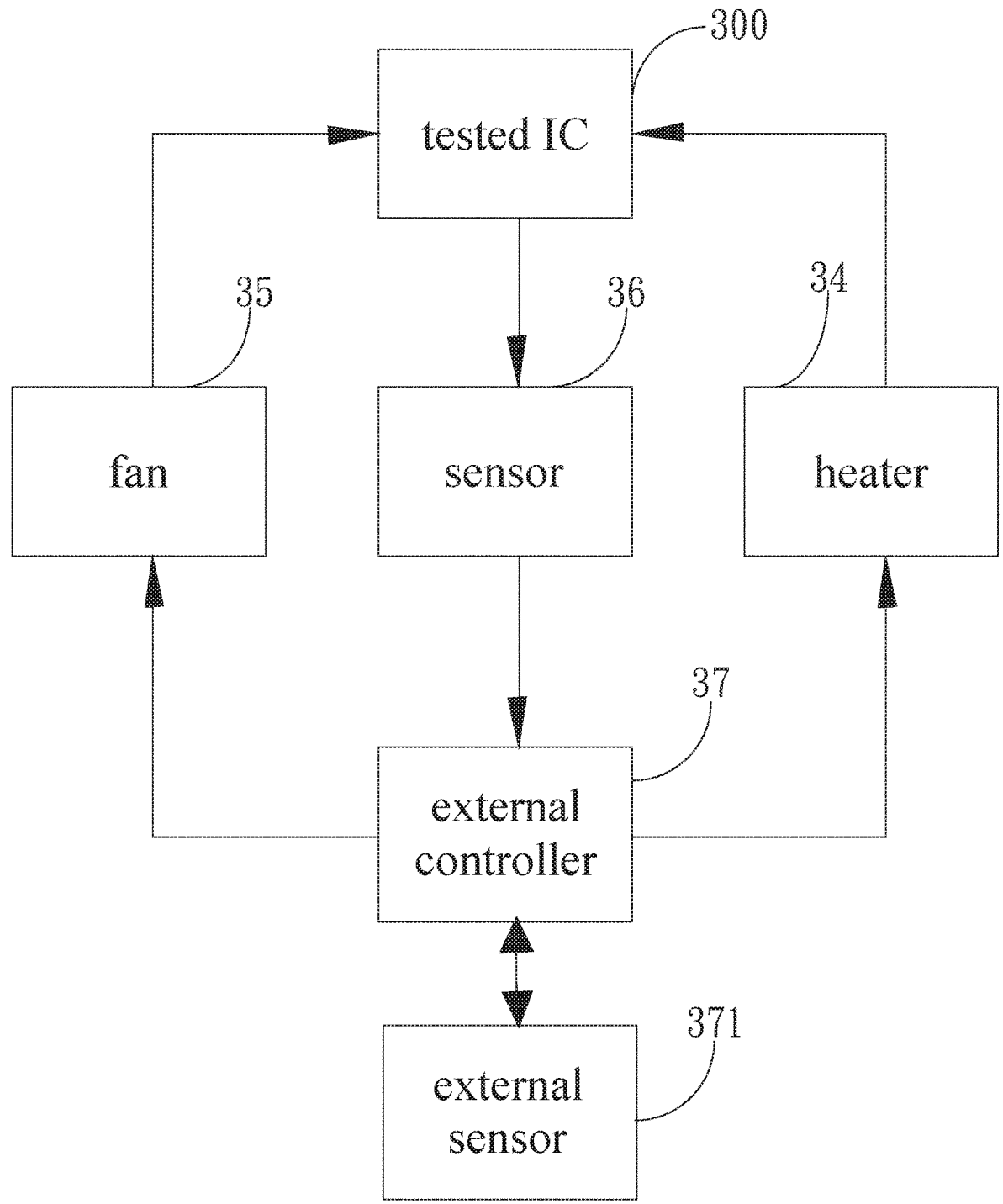
FIG. 10 illustrates a third embodiment of the present invention.

Referring further to FIG. 10, a feedback burn-in device of a burn-in oven according to a third embodiment of the present invention, also designated at 100, is shown, wherein the external controller 37 of the feedback burn-in unit 30 that is shown in FIG. 8 is shown further connected to at least one the external sensor 371, so that the external sensor 371 may detect an external environmental temperature, a feedback airflow temperature, airflow speed and air flow status flowing over the top surface of the tested IC 300 for the feedback burn-in device 100 of the burn-in oven, and the external sensor 371 provides feedback to the external controller 37, to allow the external controller 37 to more precisely control a heating temperature of the heater 34 and a dissipating airflow speed of the fan 35.

Figure 11:
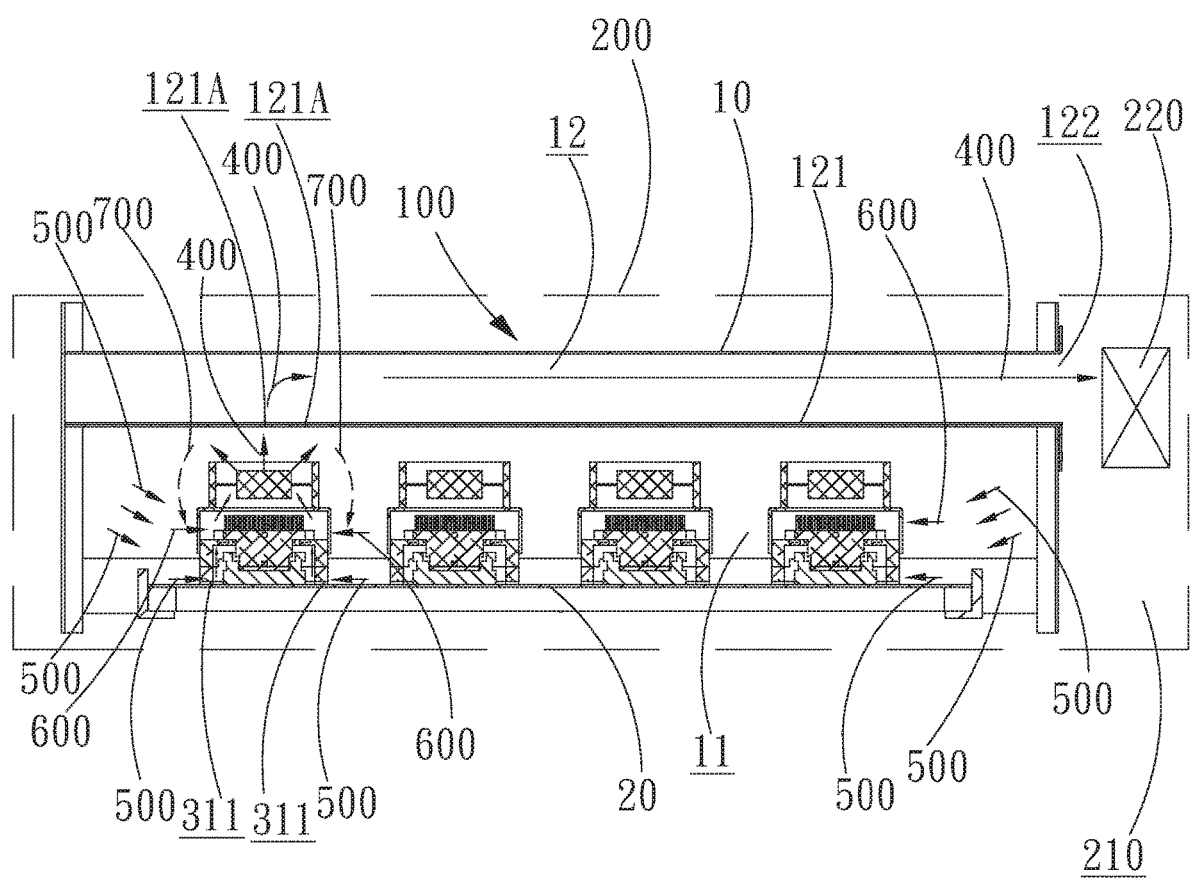
FIG. 11 is a schematic view showing an application of the feedback burn-in device of the burn-in oven according to the present invention.

Referring further to FIG. 11, an example of application of the feedback burn-in device 100 of the burn-in oven according to the present invention is shown, wherein the burn-in rack 10 is shown disposed in an interior of a burn-in oven 200. The bottom of the socket 310 of the tested IC 300 is connected to the burn-in board 20. When the fan 35 of each feedback burn-in unit 30 of the feedback burn-in device 100 of the burn-in oven according to the present invention is controlled by the external controller 37 to operate to upward draw and discharge heat-dissipation hot air 400 from the tested IC 300 and the heat dissipation fin assembly 33 of the feedback burn-in unit 30, an environmental temperature airflow 500 that is from the outside and has a lower temperature is drawn in from the front side of the receiving space 11 of the burn-in rack 10 to pass over the surface of the burn-in board 20, the air inlet channel 311 of the bottom base 31, the air flow channel 322 of the top cover 32, and the external cold air 600 passes through the opening 353 of the fan mount 351 to continuously supply to the tested IC 300 and the heat dissipation fin assembly 33 to perform control of temperature reduction. A major portion of the heat-dissipation hot air 400 is discharged upward through the airflow guide holes 121A of the holed airflow guide plate 121 of the burn-in rack 10 into the horizontal ventilation passage 12 (as indicated by the arrows shown in FIG. 11), and is further discharged through the hot airflow outlet opening 122 at one side of the horizontal ventilation passage 121A to a negative pressure zone 210 or a discharge blower 220 of the burn-in oven 200 to the outside, while a minor portion of the heat-dissipation hot air 400, upon contacting a portion of the holed airflow guide plate 121 that is not formed with the airflow guide holes 121A, is caused to move downward to form at least one feedback hot airflow 700 to feed back and provide to the tested IC 300 for accelerating the rate of temperature increasing to a burn-in temperature.

In addition, it is noted that in the feedback burn-in device 100 of the burn-in oven according to the present invention provided above, each of the bottom base 31, the top cover 32, the heat dissipation fin assembly 33, the heater 34, the fan 35, the sensor 36 and the external controller 37 of the feedback burn-in unit 30 can be independently combined and installed on each tested IC 300 of the burn-in board 20 to independently and individually provide individual burn-in temperature control and efficient energy distribution for requirements for energy consumption of burn-in and temperature control of each individual tested IC 300, so as to significantly increase performance of burn-in test of tested ICs 300 and also to allow the type and kind of each tested IC 300 on the burn-in board 20 to be different from each other, meaning simulation tests can be individually applied to each of the tested ICs 300 on the same burn-in board 20 for different elevated temperature conditions, and through coupling of each tested IC 300 to the feedback burn-in device 100 of the burn-in oven according to the present invention, the feedback burn-in device 100 of the burn-in oven provides an effect of accurate control through automatically feeding back the burn-in temperature, and the burn-in temperature of each tested IC 300 may precisely achieve burn-in temperature control for homogenized temperature in the environment to thereby greatly reduce the cost of burn-in of the tested IC 300 and also greatly increase the test performance and industrial utilization and economic value.

The feedback burn-in device 100 of the burn-in oven according to the present invention that is provided in FIGS. 1-11 is provided, in the above description and the drawings, for the purpose of explanation of the technical contents and technical solution of the present invention by way of illustrative preferred embodiments, which are not intended to limit the scope of the present invention. Minor modification of the structure, the element, and the method according to the present invention, as well as equivalent replacement thereof, is considered within the spirit and scope of the present invention that are only determined according to the appended claims.

What is claimed is:

1. A feedback burn-in device of a burn-in oven, comprising:
   at least one burn-in rack, the burn-in rack being disposed in an interior of the burn-in oven, the burn-in rack having at least one horizontal ventilation passage formed in an upper portion of the burn-in rack and being in communication with an interior of the burn-in rack, the horizontal ventilation passage having an end connected to at least one negative pressure zone or heat dissipation blower of the burn-in oven;
   at least one burn-in board, the burn-in board being disposed in the interior of the burn-in rack, the burn-in board being connected to a socket to which at least one tested IC is connectable; and
   at least one feedback burn-in unit for providing automatic feedback control of a burn-in board environment temperature, tested IC temperature detection and tested IC burn-in temperature, a dissipating airflow speed, and an environmental temperature, the feedback burn-in unit including:
      at least one bottom base coupled to and carrying the socket on the burn-in board, the bottom base having an undersurface connected to the burn-in board, the bottom base having a circumferential portion that is formed with at least one air inlet channel to draw in air from a surface of the burn-in board;
      at least one top cover, mounted on the bottom base, the top cover being formed with a framed opening, the framed opening corresponding to a top of the tested IC on the tested IC socket, the framed opening of the top cover having a circumferential portion that is formed with at least one air flow channel, the air flow channel being in communication with the air inlet channel of the bottom base to draw in air from the surface of the burn-in board;
      at least one heat dissipation fin assembly mounted on the top cover, the heat dissipation fin assembly having an undersurface that is provided with a connection portion, the connection portion being connected, by way of the framed opening of the top cover, to a top of the tested IC;
      at least one heater mounted in an interior of the heat dissipation fin assembly for providing an elevated test temperature for the heat dissipation fin assembly;
      at least one fan mounted on the heat dissipation fin assembly for discharging a heat-dissipation hot air and discharging air from the surface of the burn-in board that is drawn in through the air inlet channel of the bottom base and the air flow channel of the top cover, the fan having a bottom mounted to at least one fan mount, the fan mount being formed with at least one opening, the opening allowing the bottom of the fan and a top of the heat dissipation fin assembly to be in communication with each other, the fan mount having a circumferential portion formed with a plurality of coupling tabs, the coupling tabs being fit downward to an outside of the top cover;
      at least one sensor arranged between the top of the tested IC and the heat dissipation fin assembly for detecting the elevated test temperature of the tested IC; and
      at least one external controller connected to the sensor, the heater, and the fan, the external controller controlling a heating temperature of the heater and a dissipating airflow speed of the fan responsive to the detected elevated test temperature of the tested IC detected by the sensor;
   wherein the heat-dissipation hot air is discharged from the burn-in board and the tested IC on each feedback burn-in unit into the horizontal ventilation passage and is further discharged from one end of the horizontal ventilation passage to a negative pressure zone or a discharge blower of the burn-in oven.

2. The feedback burn-in device of the burn-in oven according to claim 1, wherein the burn-in rack is formed, in the interior thereof, with a receiving space to receive the burn-in board to dispose therein.

3. The feedback burn-in device of the burn-in oven according to claim 1, wherein at least one holed airflow guide plate is provided below the horizontal ventilation passage of the burn-in rack and is in communication with the horizontal ventilation passage of the burn-in rack to allow the heat-dissipation hot air to discharge from the burn-in board and the tested IC on each feedback burn-in unit through the holed airflow guide plate into the horizontal ventilation passage.

4. The feedback burn-in device of the burn-in oven according to claim 3, wherein the holed airflow guide plate of the burn-in rack is formed with a plurality of airflow guide hole in communication with the horizontal ventilation passage.

5. The feedback burn-in device of the burn-in oven according to claim 1, wherein the horizontal ventilation passage of the burn-in rack has an end that is formed with at least one hot airflow outlet opening in communication with the negative pressure zone and the discharge blower of the burn-in oven.

6. The feedback burn-in device of the burn-in oven according to claim 1, wherein the heat dissipation fin assembly of the feedback burn-in unit is formed with at least one receiving hole to receive the heater to dispose therein.

7. The feedback burn-in device of the burn-in oven according to claim 1, wherein four circumferential edges of a fan mount of the feedback burn-in unit are each formed with at least one opening to allow external cold air to be drawn in, through an air drawing operation of the fan, to cool the heat dissipation fin.

8. The feedback burn-in device of the burn-in oven according to claim 1, wherein the sensor of the feedback burn-in unit comprises a temperature sensor.

9. The feedback burn-in device of the burn-in oven according to claim 1, wherein the external controller of the feedback burn-in unit is mounted on the burn-in board.

10. The feedback burn-in device of the burn-in oven according to claim 1, wherein the external controller of the feedback burn-in unit is connected to at least one external sensor to detect an external environmental temperature, a feedback airflow temperature, and airflow speed and airflow status flowing over a top of the tested IC to be fed back to the external controller.

* * * * *